(12) United States Patent
Pletcher et al.

(10) Patent No.: US 8,102,205 B2
(45) Date of Patent: Jan. 24, 2012

(54) AMPLIFIER MODULE WITH MULTIPLE OPERATING MODES

(75) Inventors: Nathan M Pletcher, Encinitas, CA (US); Aristotele Hadjichristos, San Diego, CA (US); Babak Nejati, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/757,679

(22) Filed: Apr. 9, 2010

(65) Prior Publication Data

US 2011/0032035 A1   Feb. 10, 2011

Related U.S. Application Data

(60) Provisional application No. 61/231,248, filed on Aug. 4, 2009.

(51) Int. Cl.
*H03F 1/14* (2006.01)

(52) U.S. Cl. .......................................... 330/51; 330/302

(58) Field of Classification Search .................. 330/51, 330/124 R, 151, 295, 302, 310, 311
See application file for complete search history.

(56) References Cited

U.S. PATENT DOCUMENTS

| | | | |
|---|---|---|---|
| 5,661,434 A * | 8/1997 | Brozovich et al. .............. 330/51 |
| 6,069,526 A | 5/2000 | Ballantyne | |
| 6,271,722 B1 | 8/2001 | Ballantyne | |
| 7,479,827 B2 * | 1/2009 | Hau et al. ......................... 330/51 |
| 2007/0096810 A1 | 5/2007 | Hageman et al. | |
| 2007/0222523 A1 * | 9/2007 | Arell .............................. 330/302 |
| 2008/0007327 A1 | 1/2008 | Kim et al. | |

OTHER PUBLICATIONS

International Search Report and Written Opinion—PCT/US2010/044461, International Search Authority—European Patent Office—Oct. 29, 2010 (093144).

* cited by examiner

*Primary Examiner* — Khanh V Nguyen
(74) *Attorney, Agent, or Firm* — Ramin Mobarhan

(57) ABSTRACT

An amplifier module with multiple operating modes is described. In an exemplary design, the amplifier module includes an amplifier (e.g., a power amplifier), a switch, and an output circuit. The amplifier receives and amplifies an input signal and provides an amplified signal in a first mode. The switch is coupled to the output of the amplifier and bypasses the amplifier and provides a bypass signal in a second mode. The output circuit is coupled to the amplifier and the switch. The output circuit performs output impedance matching for the amplifier in the first mode. The output circuit also (i) receives the amplified signal and provides an output signal in the first mode and (ii) receives the bypass signal and provides the output signal in the second mode. The amplifier is enabled in the first mode and disabled in the second mode.

25 Claims, 8 Drawing Sheets

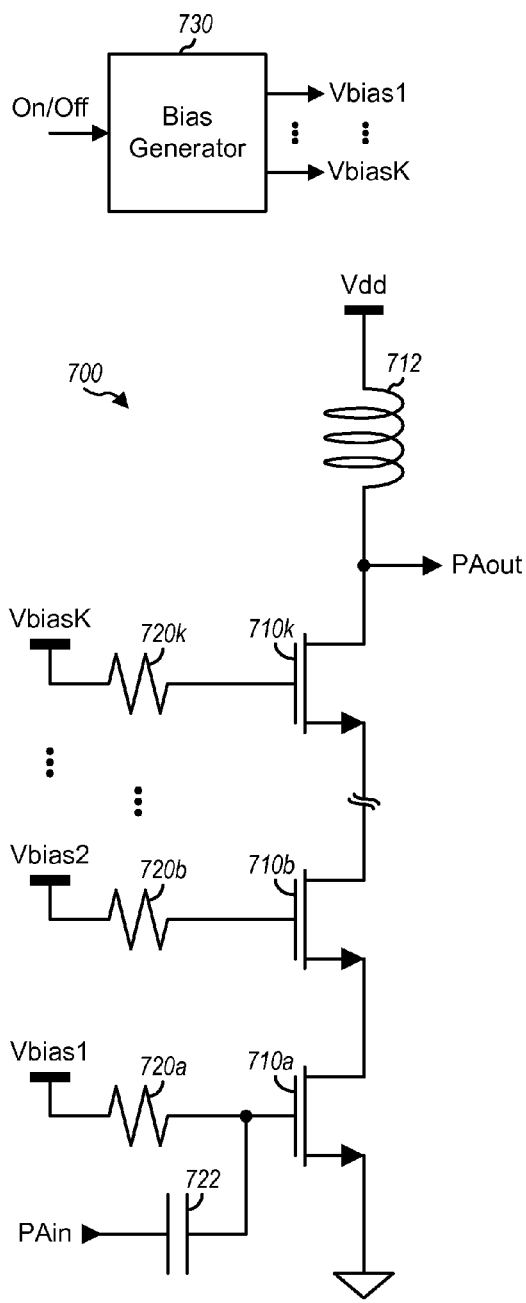

AMPLIFIER MODULE WITH MULTIPLE OPERATING MODES

CLAIM OF PRIORITY UNDER 35 U.S.C. §119

The present Application for Patent claims priority to Provisional U.S. Application Ser. No. 61/231,248, entitled "PA BYPASS ARCHITECTURE AVOIDING THE USE OF SERIES SWITCHES," filed Aug. 4, 2009, assigned to the assignee hereof, and expressly incorporated herein by reference.

BACKGROUND

I. Field

The present disclosure relates generally to electronics, and more specifically to an amplifier module.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA), the receiver may include a low noise amplifier (LNA), and the transmitter and receiver may include variable gain amplifiers (VGAs).

A transmitter may have an amplifier module that may include one or more amplifiers, e.g., a driver amplifier and a power amplifier. The amplifier module may support multiple operating modes. Each operating mode may correspond to a different output power level, a different overall gain, etc. It may be desirable to efficiently implement the multiple operating modes for the amplifier module.

BRIEF DESCRIPTION OF THE DRAWINGS

FIG. 7 shows a schematic diagram of an exemplary design of a power amplifier.

FIG. 8 shows a schematic diagram of an exemplary design of a switch.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Various exemplary designs of an amplifier module (e.g., a PA module) with multiple operating modes and having improved performance are described herein. The amplifier module may be used in various electronic devices such as wireless communication devices, cellular phones, personal digital assistants (PDAs), handheld devices, wireless modems, laptop computers, cordless phones, Bluetooth devices, consumer electronic devices, etc. For clarity, the use of the amplifier module in a wireless communication device is described below.

Figure 1:
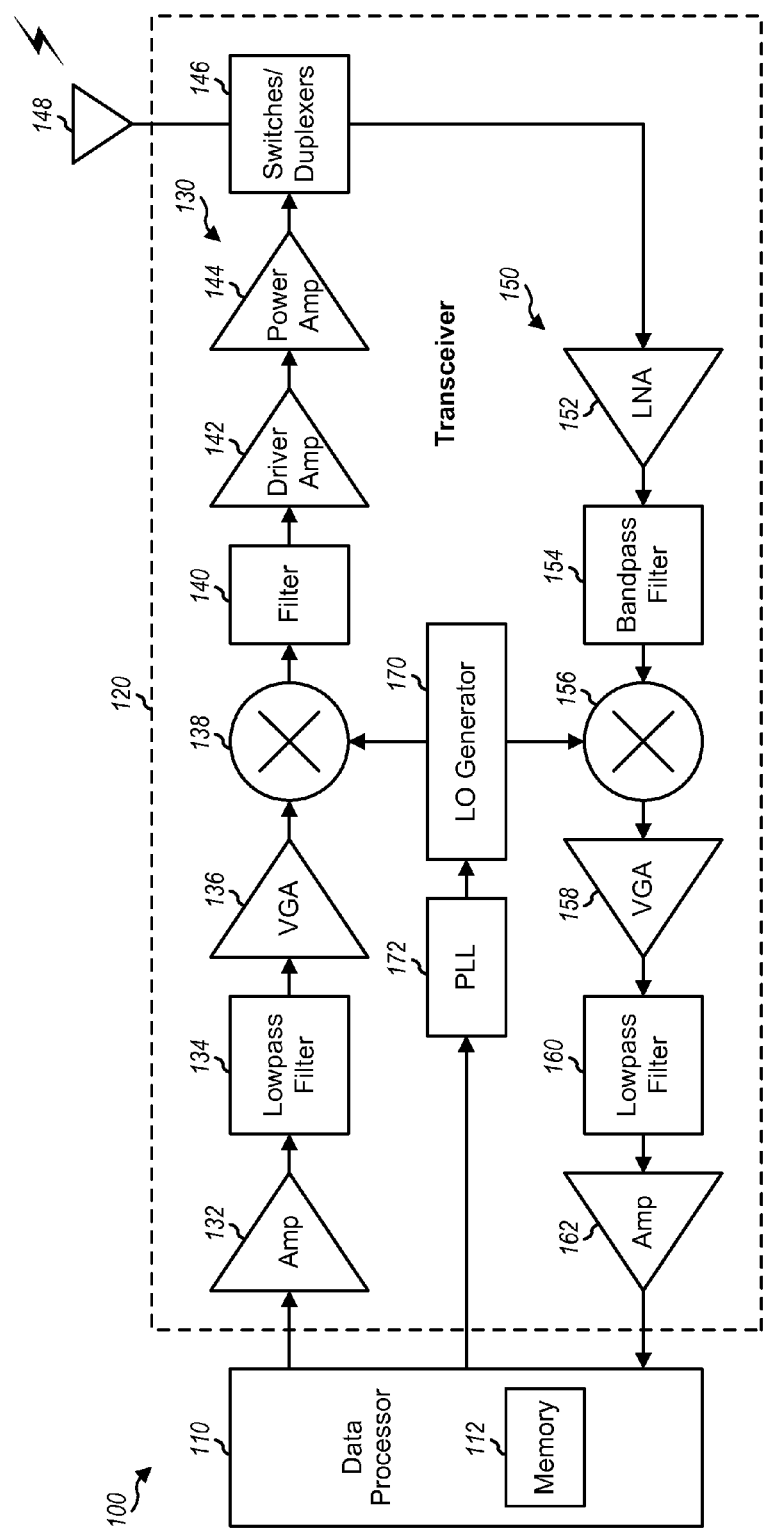
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to radio frequency (RF) by a mixer 138. The upconverted signal is filtered by a filter 140, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a superheterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. Transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

As shown in FIG. 1, a transmitter and a receiver may include various amplifiers. Each amplifier at RF may have input impedance matching and output impedance matching, which are not shown in FIG. 1 for simplicity.

Figure 2:
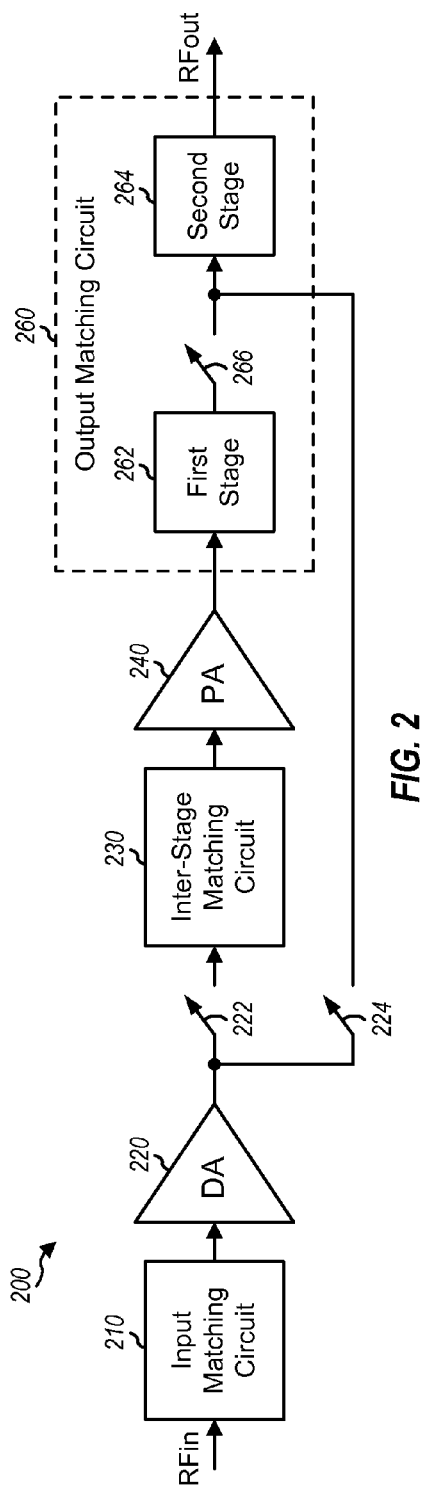
FIG. 2 shows a block diagram of a PA module with a series output switch.

FIG. 2 shows a block diagram of a PA module 200 with a series output switch. PA module 200 may be used for driver amplifier 142 and power amplifier 144 in FIG. 1. Within PA module 200, an input matching circuit 210 receives an input RF signal (RFin) and has its output coupled to the input of a driver amplifier 220. The output of driver amplifier 220 is coupled to one end of switches 222 and 224. The other end of switch 222 is coupled to the input of an inter-stage matching circuit 230. A power amplifier 240 has its input coupled to the output of inter-stage matching circuit 230 and its output coupled to the input of an output matching circuit 260. Output matching circuit 260 includes a first stage 262, a switch 266, and a second stage 264 coupled in series. The other end of switch 224 is coupled to the input of second stage 264. Output matching circuit 260 provides an output RF signal (RFout).

PA module 200 supports a high power mode and a bypass mode. In the high power mode, switches 222 and 266 are closed, switch 224 is opened, and driver amplifier 220 and power amplifier 240 are both enabled. Amplifiers 220 and 240 provide signal amplification and high output power for the RFout signal. Matching circuit 210 performs input impedance matching for driver amplifier 220. Matching circuit 230 performs impedance matching between the output of driver amplifier 220 and the input of power amplifier 240. First stage 262 and second stage 264 perform output impedance matching for power amplifier 240. In the bypass mode, switches 222 and 266 are opened, switch 224 is closed, driver amplifier 220 is enabled, and power amplifier 240 is disabled. Driver amplifier 220 provides signal amplification and low to medium output power for the RFout signal. An amplified signal from driver amplifier 220 is routed through second stage 264 and provided as the RFout signal. Second stage 264 performs output impedance matching for driver amplifier 220.

PA module 200 can support multiple operating modes. The high power mode may be selected to obtain high output power, and the bypass mode may be selected to obtain low or medium output power. In the high power mode, power amplifier 240 is enabled and provides its output via impedance matching stages 262 and 264 and switch 266. Switch 266 is an output switch that is coupled in series in the output path after power amplifier 240. Switch 266 has some resistance when it is turned on, and this on resistance results in some signal/insertion loss in the output path. This signal loss may be undesirable, especially at high output power.

Figure 3:
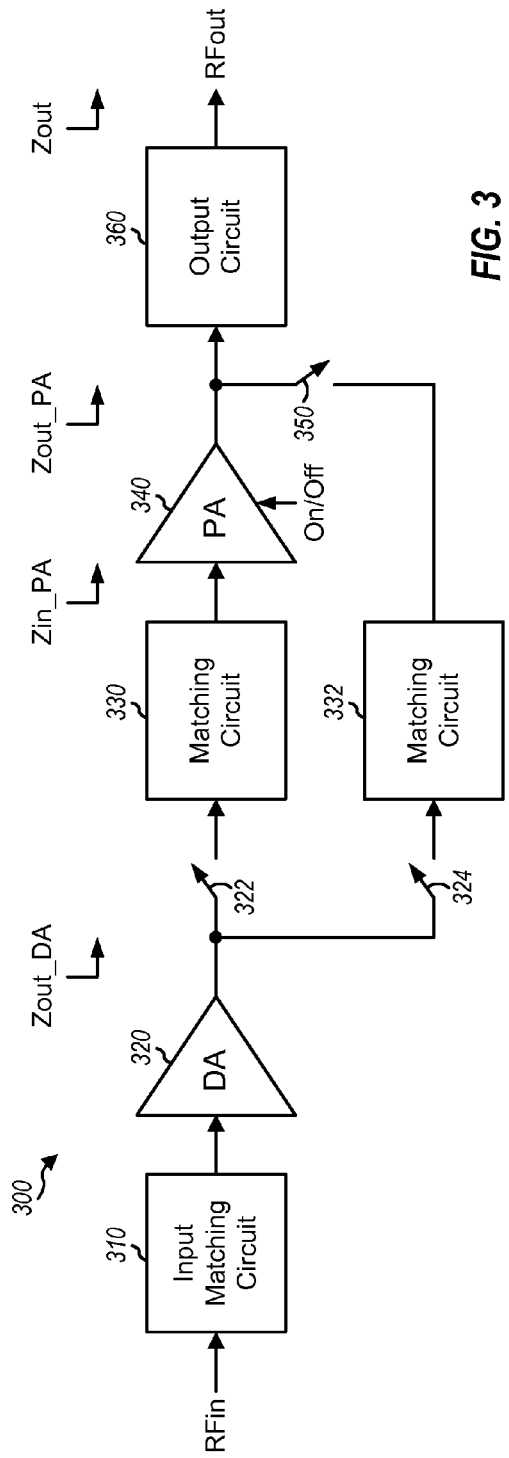
FIG. 3 shows a block diagram of an exemplary design of a PA module with a shunt output switch.

FIG. 3 shows a block diagram of an exemplary design of a PA module 300 with a shunt output switch. PA module 300 may also be used for driver amplifier 142 and power amplifier 144 in FIG. 1. Within PA module 300, an input matching circuit 310 receives an RFin signal and has its output coupled to the input of a driver amplifier 320. The output of driver amplifier 320 is coupled to one end of switches 322 and 324. Switches 322 and 324 have their other end coupled to the inputs of matching circuits 330 and 332, respectively. A power amplifier 340 has its input coupled to the output of matching circuit 330 and its output coupled to the input of an output circuit 360. Output circuit 360 provides an RFout signal. A switch 350 has one end coupled to the output of power amplifier 340 and the other end coupled to the output of matching circuit 332.

Power amplifier 340 may be enabled or disabled based on an On/Off control signal. For example, the On/Off signal may turn on one or more transistors within power amplifier 340 when it is enabled and may turn off the transistor(s) when power amplifier 340 is disabled.

PA module 300 supports a high power mode and a bypass mode. In the high power mode, switch 322 is closed, switches 324 and 350 are opened, and driver amplifier 320 and power amplifier 340 are both enabled. Amplifiers 320 and 340 provide signal amplification and high output power for the RFout signal. Matching circuit 310 performs input impedance matching for driver amplifier 320. Matching circuit 330 performs impedance matching between the output of driver amplifier 320 (Zout_DA) and the input of power amplifier 340 (Zin_PA). Output circuit 360 performs output impedance matching for power amplifier 340 and may match a low output impedance (Zout_PA) of power amplifier 340 to a target output impedance (Zout). For example, Zout_PA may be 2 to 4 Ohms, and Zout may be 50 Ohms.

In the bypass mode, switch 322 is opened, switches 324 and 350 are closed, driver amplifier 320 is enabled, and power amplifier 340 is disabled. Driver amplifier 320 provides signal amplification and low to medium output power for the RFout signal. An amplified signal from driver amplifier 320 is routed through matching circuit 332, switch 350, and output circuit 360 and provided as the RFout signal. Matching circuit 332 performs impedance matching between the output of driver amplifier 320 and the input of output circuit 360. Output circuit 360 may be designed to perform output impedance matching for power amplifier 340 and may have a low input impedance. Matching circuit 332 may match a moderate output impedance (e.g., 20 to 30 Ohms) of driver amplifier 320 to the low input impedance of output circuit 360.

PA module 300 can support multiple operating modes. The high power mode may be selected to obtain high output power, and the bypass mode may be selected to obtain low or medium output power. In the high power mode, power amplifier 340 is enabled and provides its output via output circuit 360. No series switch is present in the output path after power amplifier 340. This avoids signal loss in the output path due to a series switch. A series switch 322 is present in the signal path from driver amplifier 320 to power amplifier 340. However, the signal level at the output of driver amplifier 320 may be smaller than the signal level at the output of power amplifier 340. Hence, signal loss due to switch 322 may be negligible. Shunt switch 350 is opened in the high power mode and isolates matching circuit 332 from the output of power amplifier 340.

In the bypass mode, driver amplifier 320 provides its output via matching circuit 332 and output circuit 360. Matching circuit 332 can perform impedance matching so that driver amplifier 320 can observe similar output impedance in both the high power mode and the bypass mode. Furthermore, matching circuit 332 allows for independent impedance matching in the bypass mode while reusing output circuit 360, which may be designed specifically for the high power mode. Shunt switch 350 is closed in the bypass mode and should be sufficiently large in order to reduce degradation in the bypass mode.

Figure 4:
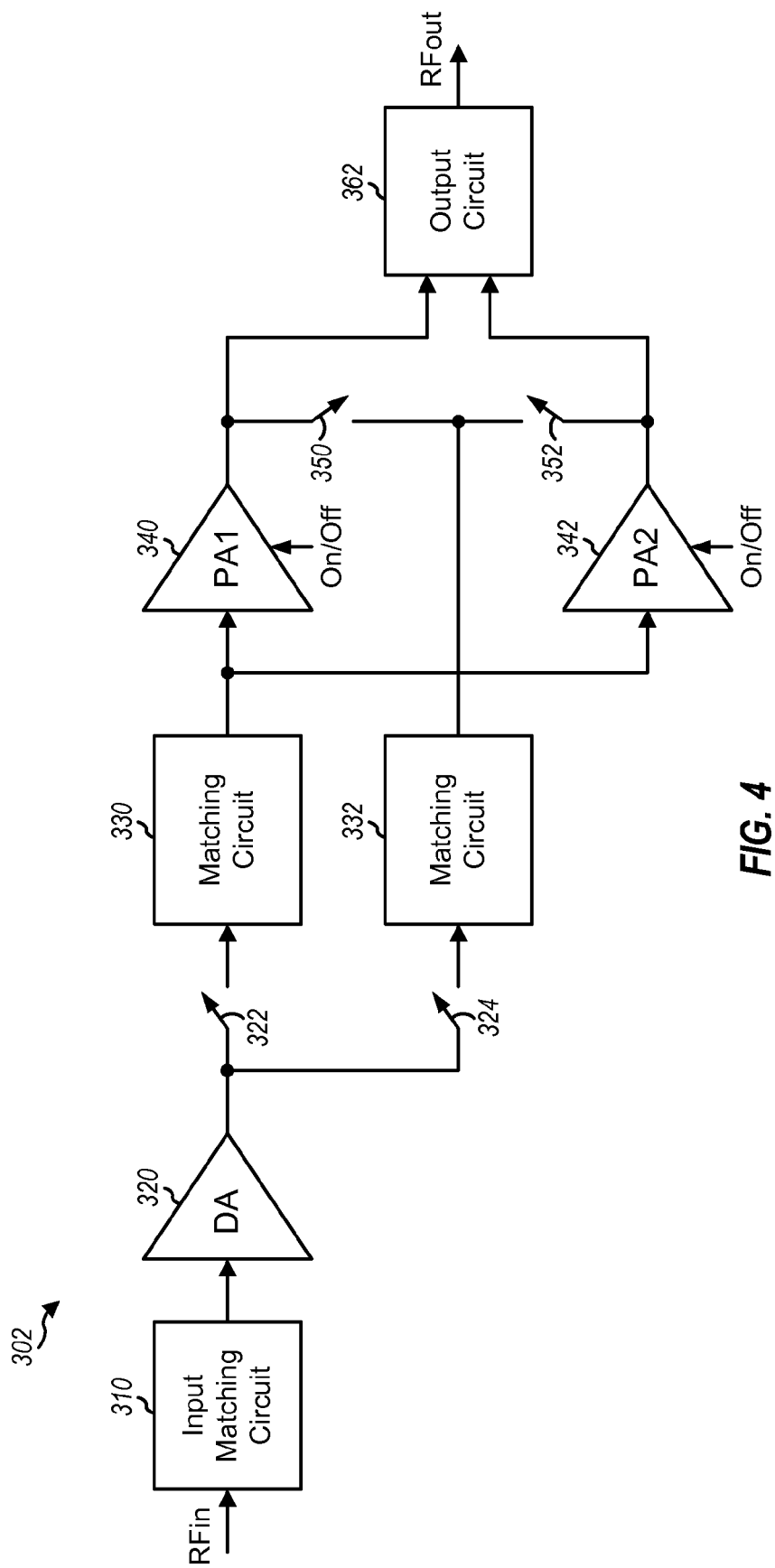
FIG. 4 shows a block diagram of an exemplary design of a PA module with two power amplifiers and shunt output switches.

FIG. 4 shows a block diagram of an exemplary design of a PA module 302 with shunt output switches. PA module 302 includes driver amplifier 320, power amplifier 340, matching circuits 310, 330 and 332, and switches 322 and 324, which are coupled as described above for PA module 300 in FIG. 3. PA module 302 further includes a power amplifier 342, shunt switches 350 and 352, and an output circuit 362 (which replaces output circuit 360 in FIG. 3). Power amplifier 342 has its input coupled to the output of matching circuit 332 and its output coupled to the input of output circuit 362. Switch 350 has one end coupled to the output of power amplifier 340 and the other end coupled to the output of matching circuit 332. Similarly, switch 352 has one end coupled to the output of power amplifier 342 and the other end coupled to the output of matching circuit 332. Output circuit 362 has its two inputs coupled to the outputs of power amplifiers 340 and 342 and its output providing an RFout signal.

PA module 302 supports a high power mode and a bypass mode. In the exemplary design shown in FIG. 4, power amplifiers 340 and 342 are both enabled by a common On/Off control signal in the high power mode and are both disabled by the On/Off control signal in the bypass mode.

Figure 5A:
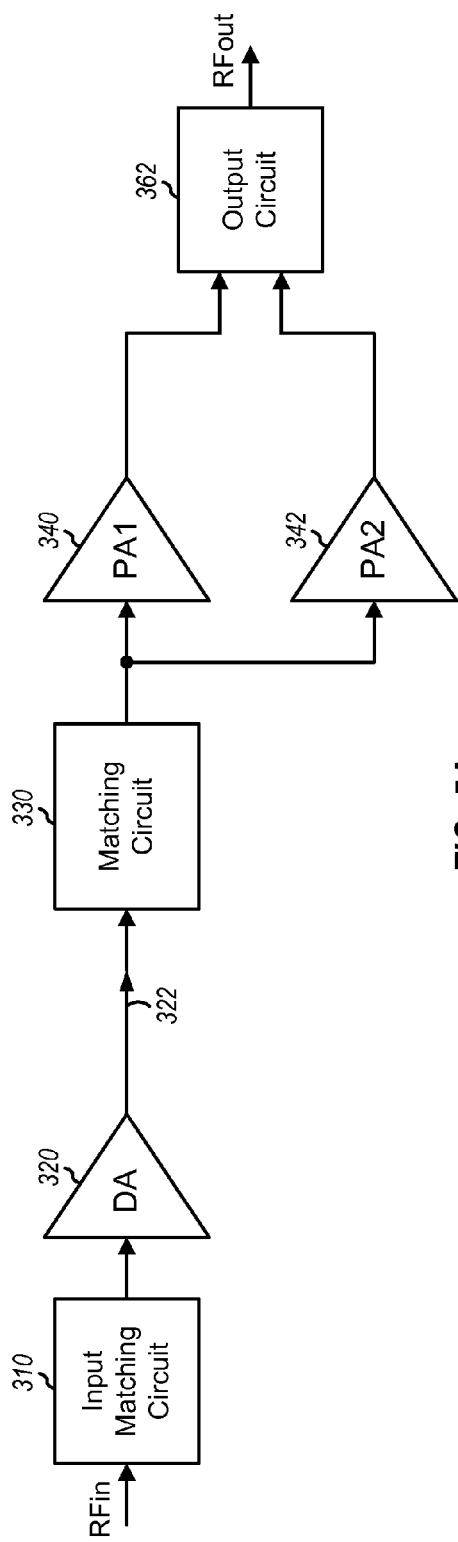
FIGS. 5A and 5B show operation of the PA module in FIG. 4 in a high power mode and a bypass mode, respectively.

FIG. 5A shows the operation of PA module 302 in the high power mode. In this mode, switch 322 is closed, switches 324, 350 and 352 are opened, and driver amplifier 320 and power amplifiers 340 and 342 are all enabled. Amplifiers 320, 340 and 342 provide signal amplification and high output power for the RFout signal. Matching circuit 310 performs input impedance matching for driver amplifier 320. Matching circuit 330 performs impedance matching between the output of driver amplifier 320 and the inputs of power amplifiers 340 and 342. For example, matching circuit 330 may match a moderate output impedance (e.g., 20 to 30 Ohms) of driver amplifier 320 to a low input impedance (Zin_PAs) of power amplifiers 340 and 342. The input impedance may be expressed as:

$$\text{Zin\_PAs} = (\text{Zin\_PA1} \| \text{Zin\_PA2}) = \frac{\text{Zin\_PA1} \times \text{Zin\_PA2}}{\text{Zin\_PA1} + \text{Zin\_PA2}}, \quad \text{Eq (1)}$$

where

Zin_PA1 is the input impedance of power amplifier 340,
Zin_PA2 is the input impedance of power amplifier 342, and
"$\|$" denotes a parallel combination.

Output circuit 362 performs output impedance matching and signal combining for power amplifiers 340 and 342. Output circuit 362 provides a target output impedance (Zout_PAn) for each power amplifier, combines the outputs of the two power amplifiers, and provides the target output impedance (Zout). Output circuit 362 may be implemented as described below.

As shown in FIG. 5A, no series switches are present in the output paths after power amplifiers 340 and 342. This avoids signal loss in the output paths due to series switches. Shunt switches 350 and 352 are opened in the high power mode and isolate matching circuit 332 from the outputs of power amplifiers 340 and 342.

Figure 5B:
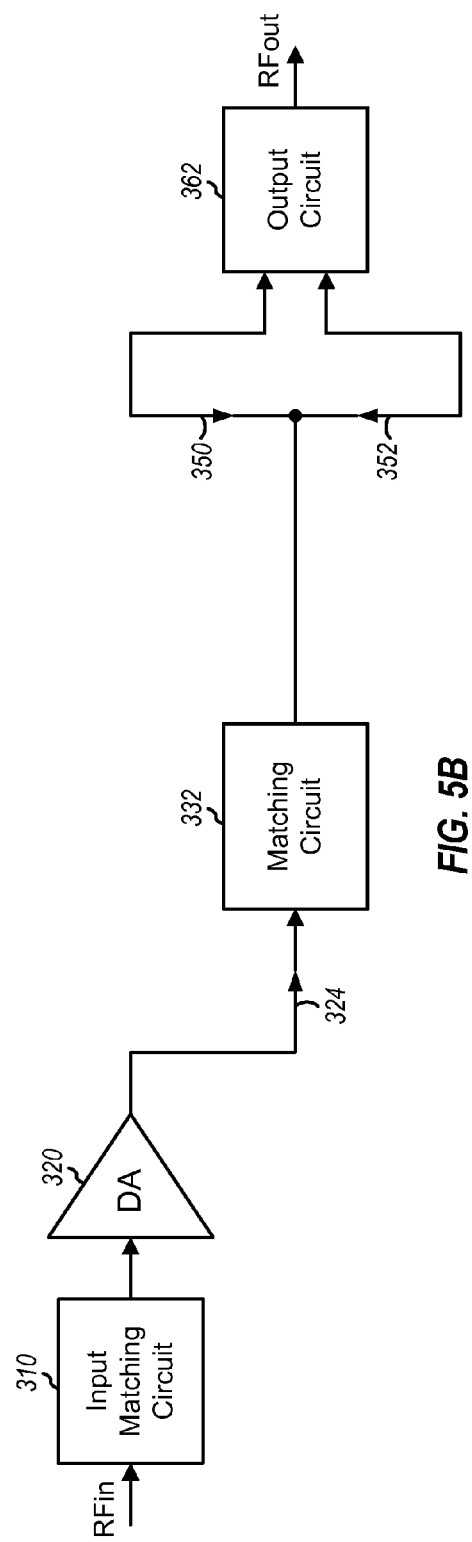

FIG. 5B shows the operation of PA module 302 in the bypass mode. In this mode, switch 322 is opened, switches 324, 350 and 352 are closed, driver amplifier 320 is enabled, and power amplifiers 340 and 342 are disabled. Driver amplifier 320 provides signal amplification and low to medium output power for the RFout signal. An amplified signal from driver amplifier 320 is routed through matching circuit 332 and output circuit 362 and provided as the RFout signal. Matching circuit 332 performs impedance matching between the output of driver amplifier 320 and the two inputs of output circuit 362. Output circuit 362 may be designed to perform output impedance matching for power amplifiers 340 and 342 and may have a low input impedance at each of the two inputs. Matching circuit 332 may match a moderate output impedance (e.g., 20 to 30 Ohms) of driver amplifier 320 to the low input impedance of output circuit 362. Although not shown in FIG. 5B for simplicity, the input impedance of output circuit 362 may be dependent on the load inductors of power amplifiers 340 and 342 even though these power amplifiers are disabled in the bypass mode.

Matching circuit 332 can perform impedance matching so that driver amplifier 320 can observe similar output impedance in both the high power mode and the bypass mode. Furthermore, matching circuit 332 allows for independent impedance matching in the bypass mode while reusing output circuit 362, which may be designed specifically for the high power mode. Shunt switches 350 and 352 are closed in the bypass mode and should be sufficiently large in order to reduce degradation in the bypass mode.

Figure 6:
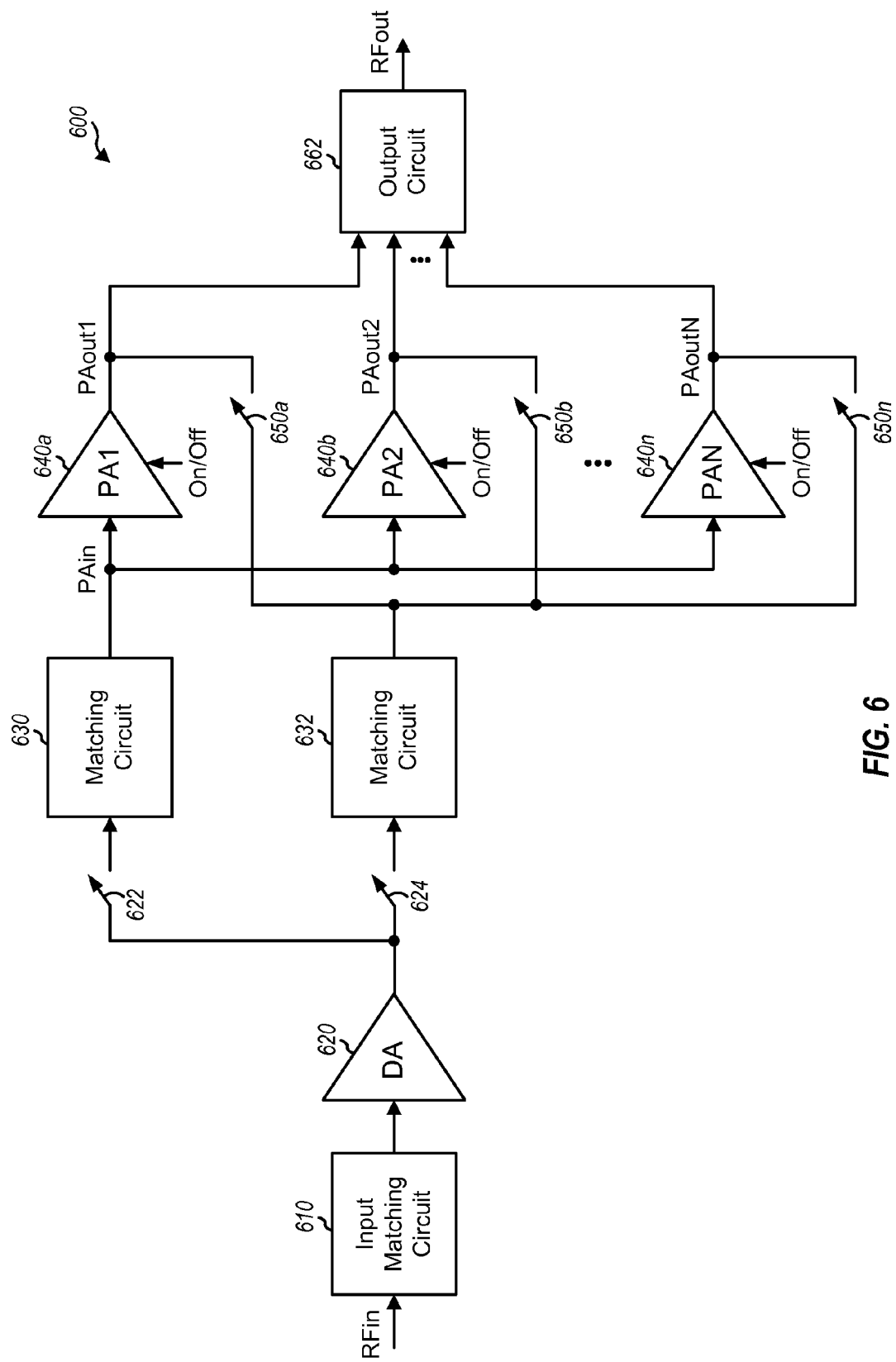
FIG. 6 shows a block diagram of an exemplary design of a PA module with multiple power amplifiers coupled in parallel.

FIG. 6 shows an exemplary design of a PA module 600 with multiple (N) power amplifiers coupled in parallel, where N may be any integer value. PA module 600 includes an input matching circuit 610, a driver amplifier 620 coupled to the output of matching circuit 610, switches 622 and 624 having one end coupled to the output of driver amplifier 620, and matching circuits 630 and 632 coupled to the other ends of switches 622 and 624, respectively. N power amplifiers 640a through 640n have their inputs coupled to the output of matching circuit 630 and their outputs coupled to N inputs of an output circuit 662. N shunt switches 650a through 650n are used for N power amplifiers 640a through 640n, respectively. Each shunt switch 650 is coupled between the output of an associated power amplifier 640 and the output of matching circuit 632. Matching circuit 630 performs impedance matching between the output of driver amplifier 620 and the inputs of the N power amplifiers 640a through 640n. The input impedance of the N power amplifiers 640 may be given as Zin_PA=(Zin_PA1$\|$Zin_PA2$\|$ . . . $\|$Zin_PAN), where Zin_PAn is the input impedance of the n-th power amplifier 640, with n=1, . . . , N. Output circuit 662 performs output impedance matching for each power amplifier 640, combines the outputs of the N power amplifiers, and provides a target output impedance (Zout). Matching circuit 632 performs impedance matching between the output of driver amplifier 620 and the N inputs of output circuit 662.

The PA modules in FIGS. 3, 4 and 6 allow the power amplifier(s) to be bypassed when high output power is not needed. Each power amplifier may be bypassed at its output, before the output impedance matching. No series switches are used in the output path after the power amplifier in the high power mode, which may then avoid signal loss due to the on resistance of the switches. Improved efficiency may be achieved for the power amplifier in the high power mode without the series switches. This is desirable since efficiency at maximum output power is an important performance metric for the power amplifier.

FIG. 7 shows a schematic diagram of an exemplary design of a power amplifier 700, which may be used for any one of the power amplifiers in FIGS. 3, 4 and 6. Power amplifier 700 includes K N-channel metal oxide semiconductor (NMOS)

transistors 710a through 710k coupled in a stack, where K may be any integer value. The bottommost NMOS transistor 710a has its source coupled to circuit ground and its gate receiving an input signal (PAin) via an AC coupling capacitor 722. Each higher up NMOS transistor 710 in the stack has its source coupled to the drain of another NMOS transistor below in the stack. The topmost NMOS transistor 710k has its drain providing an output signal (PAout). A load inductor 712 is coupled between a power supply (Vdd) and the drain of the topmost NMOS transistor 710k and provides DC bias current for power amplifier 700. Load inductor 712 may be part of an output circuit that is coupled to power amplifier 700. The gates of NMOS transistor 710a through 710k receive K bias voltages, Vbias1 through VbiasK, via K resistors 720a through 720k, respectively.

A bias generator 730 receives the On/Off control signal and generates the K bias voltages for NMOS transistors 710a through 710k. Bias generator 730 provides nominal bias voltages to turn on power amplifier 700 when the On/Off signal is at a first logic level (e.g., '1'). Bias generator 730 provides low bias voltages to turn off power amplifier 700 when the On/Off signal is at a second logic level (e.g., '0').

The PAout signal may have a large voltage swing, which may exceed a breakdown voltage of each NMOS transistor 710. The large voltage swing of the PAout signal may be split or distributed approximately equally across the K NMOS transistors 710a through 710k. Each NMOS transistor 710 may then observe only a fraction of the voltage swing, which should be less than the breakdown voltage of each NMOS transistor to achieve high reliability. The use of stacked transistors may be especially desirable for high frequency power amplifiers implemented with transistors that are fabricated with deep sub-micron IC processes and have low breakdown voltages. The K bias voltages Vbias1 through VbiasK may be selected to provide the desired voltage splitting of the PAout signal, e.g., so that each NMOS transistor observes about 1/K-th of the voltage swing.

FIG. 7 shows an exemplary design of a power amplifier, which may also be implemented in other manners. For example, a power amplifier may be implemented with transistors of other types, or other circuit topologies, etc. The exemplary design shown in FIG. 7 may also be used for any one of the driver amplifiers in FIGS. 3, 4 and 6. The number of stacked NMOS transistors, the transistor size, the load inductor, the bias voltages, and/or other circuit characteristics may be different for a driver amplifier and a power amplifier.

FIG. 8 shows a schematic diagram of a switch 800, which may be used for any one of the shunt switches in FIGS. 3, 4 and 6. Within switch 800, M NMOS transistors 810a through 810m are coupled in a stacked, where M may be any integer value. Each NMOS transistor 810 (except for the bottommost NMOS transistor 810a) has its source coupled to the drain of the next NMOS transistor in the stack. The topmost NMOS transistor 810m has its drain receiving an input signal (Vin), and the bottommost NMOS transistor 810a has its source providing an output signal (Vout). Each NMOS transistor 810 may be implemented with a symmetric structure, and the source and drain of each NMOS transistor may be interchangeable. M resistors 820a through 820k have one end coupled to node A and the other end coupled to the gates of NMOS transistors 810a through 810k, respectively. A mode control signal (Mode) is provided to node A.

Resistors 820a through 820m may have relatively large resistance, e.g., in the kilo Ohms range. When NMOS transistors 810 are turned on, resistors 820 may reduce signal loss by presenting a large resistance to the Vin signal in the leakage path through gate-to-source and gate-to-drain capacitances of each NMOS transistor. When NMOS transistors 810 are turned off, resistors 820 may help to distribute the voltage swing of the Vin signal approximately evenly across the M NMOS transistors 810 in the stack. NMOS transistors 810 may be designed with a sufficiently large size in order to reduce the on resistance when switch 800 is turned on.

FIG. 8 shows an exemplary design of a switch, which may also be implemented in other manners. For example, a switch may be implemented with transistors of other types, or with other circuit topologies, etc. A switch may also be implemented with micro-electro-mechanical system (MEMS).

Figure 9A:
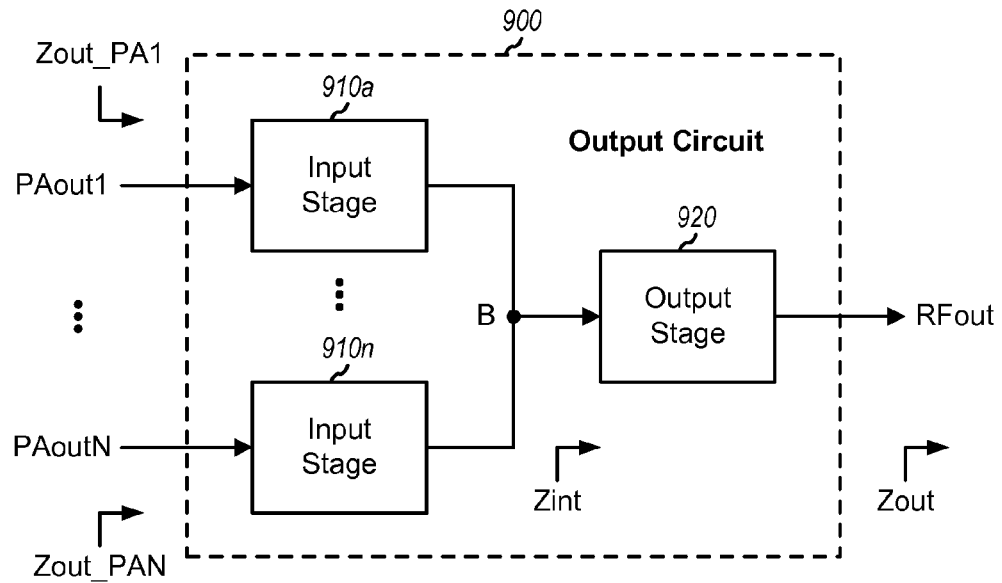
FIGS. 9A and 9B show block diagrams of exemplary designs of an output circuit.

FIG. 9A shows a block diagram of an exemplary design of an output circuit 900, which may be used for output circuit 362 in FIG. 4 or output circuit 662 in FIG. 6. In the exemplary design shown in FIG. 9A, output circuit 900 includes N input stages 910a through 910n and an output stage 920, where N may be any integer value. Each input stage 910 has its input receiving a PAout signal from an associated power amplifier and its output coupled to node B. Output stage 920 has its input coupled to node B and its output providing the RFout signal.

In an exemplary design, each input stage 910 performs impedance matching between an output impedance (Zout_PAn) of the associated power amplifier and the target output impedance (Zout). A target intermediate impedance (Zint) at node B may then be expressed as Zint=Zout/N. Input stages 910a through 910n may have the same or different input impedances, depending on the target output impedances of the power amplifiers coupled to the input stages. Output stage 920 performs impedance matching between the target intermediate impedance at node B and the target output impedance.

Figure 9B:
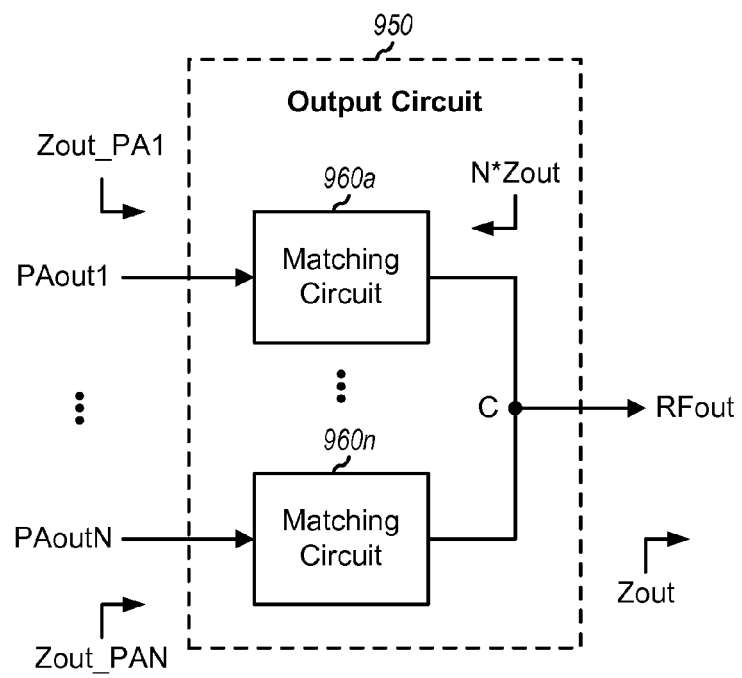

FIG. 9B shows a block diagram of an exemplary design of an output circuit 950, which may also be used for output circuit 362 in FIG. 4 or output circuit 662 in FIG. 6. In the exemplary design shown in FIG. 9B, output circuit 950 includes N matching circuits 960a through 960n. Each matching circuit 960 has its input receiving a PAout signal from an associated power amplifier and its output coupled to node C. Node C provides the RFout signal.

In an exemplary design, each matching circuit 960 performs impedance matching between an output impedance (Zout_PAn) of an associated power amplifier and a high output impedance of Zo=N×Zout. Matching circuits 960a through 960n may have the same or different input impedances, depending on the target output impedances of the power amplifiers coupled to matching circuits 960. Since matching circuits 960 are coupled in parallel, and the target output impedance may be given as Zout=Zo/N.

A matching circuit or stage may be implemented with various topologies. For example, a matching circuit or stage may be implemented with (i) a shunt capacitor between the input and circuit ground and a series inductor between the input and output, (ii) a shunt inductor between the input and circuit ground and a series capacitor between the input and output, (iii) a series inductor between the input and output and a shunt capacitor between the output and circuit ground, (iv) a shunt capacitor between the input and circuit ground, a series inductor between the input and output, and another shunt capacitor between the output and circuit ground, or (v) some other circuit topology. A matching circuit or stage may also be implemented with any number of sections, and each section may be implemented as described above. A matching circuit or stage may be fixed and may have a nominal input impedance and a nominal output impedance. A matching circuit or stage may also be tunable and may include at least one reactive component (e.g., a capacitor) that may be varied to adjust impedance matching.

In an exemplary design, an apparatus may comprise a first amplifier, a first switch, and an output circuit, e.g., as shown in FIG. 3. The first amplifier (e.g., power amplifier 340) may receive and amplify an input signal and provide an amplified signal in a first mode (e.g., the high power mode). The first switch (e.g., switch 350) may be coupled to the output of the first amplifier and may bypass the first amplifier and provide a bypass signal in a second mode (e.g., the bypass mode). The output circuit (e.g., output circuit 360) may be coupled to the first amplifier and the first switch. The output circuit may perform output impedance matching for the first amplifier in the first mode. The output circuit may also (i) receive the amplified signal and provide an output signal in the first mode and (ii) receive the bypass signal and provide the output signal in the second mode. The first amplifier may comprise a power amplifier that may be enabled in the first mode and disabled in the second mode.

In an exemplary design, the apparatus may further comprise first and second matching circuits, e.g., as shown in FIG. 3. The first matching circuit (e.g., matching circuit 330) may be coupled to the input of the first amplifier and may perform input impedance matching for the first amplifier in the first mode. The second matching circuit (e.g., matching circuit 332) may be coupled to the first switch and may perform impedance matching in the second mode. In an exemplary design, the apparatus may further comprise a second amplifier and second and third switches, e.g., as also shown in FIG. 3. The second amplifier (e.g., driver amplifier 320) may receive and amplify a second input signal and provide a second amplified signal. The second switch may be coupled between the second amplifier and the first matching circuit and may route the second amplified signal to the first matching circuit in the first mode. The third switch may be coupled between the second amplifier and the second matching circuit and may route the second amplified signal to the second matching circuit in the second mode. The second amplifier may observe a target output impedance from the first matching circuit in the first mode and from the second matching circuit in the second mode. The first and second amplifiers may be enabled in the first mode. The first amplifier may be disabled and the second amplifier may be enabled in the second mode.

In an exemplary design, the apparatus may further comprise a second amplifier and a second switch, e.g., as shown in FIG. 4. The second amplifier (e.g., power amplifier 342) may receive and amplify the input signal and provide a second amplified signal in the first mode. The second switch (e.g., switch 352) may be coupled to the output of the second amplifier and may bypass the second amplifier and provide the bypass signal in the second mode. The output circuit (e.g., output circuit 362) may be further coupled to the second amplifier and the second switch. The output circuit may perform output impedance matching and signal combining for the first and second amplifiers in the first mode. The output circuit may receive the two amplified signals and provide the output signal in the first mode. The output circuit may receive the bypass signal and provide the output signal in the second mode. The first and second amplifiers may be enabled in the first mode and may be disabled in the second mode.

In an exemplary design, the apparatus may further comprise first and second matching circuits, e.g., as shown in FIG. 4. The first matching circuit (e.g., matching circuit 330) may be coupled to the inputs of the first and second amplifiers and may perform input impedance matching for the first and second amplifiers in the first mode. The second matching circuit (e.g., matching circuit 332) may be coupled to the first and second switches and may perform impedance matching in the second mode. The apparatus may further comprise a third amplifier and third and fourth switches, e.g., as also shown in FIG. 4. The third amplifier (e.g., driver amplifier 320) may receive and amplify a second input signal and provide a third amplified signal. The third switch (e.g., switch 322) may be coupled between the third amplifier and the first matching circuit and may route the third amplified signal to the first matching circuit in the first mode. The fourth switch (e.g., switch 324) may be coupled between the third amplifier and the second matching circuit and may route the third amplified signal to the second matching circuit in the second mode.

In an exemplary design, the output circuit may comprise first and second input stages and an output stage, e.g., as shown in FIG. 9A. The first input stage (e.g., input stage 910a) may be coupled to the output of the first amplifier and may perform output impedance matching for the first amplifier. The second input stage (e.g., input stage 910n) may be coupled to the output of the second amplifier and may perform output impedance matching for the second amplifier. The output stage (e.g., output stage 920) may be coupled to the first and second input stages and may perform impedance matching from a target intermediate impedance (Zint) to a target output impedance (Zout). The target intermediate impedance may be equal to the target output impedance divided by N, where N may be the number of amplifiers coupled to the output circuit.

In an exemplary design, the first amplifier may comprise a plurality of MOS transistors coupled in a stack, e.g., as shown in FIG. 7. One of the MOS transistors may receive the input signal, and another one of the MOS transistors may provide the amplified signal.

In an exemplary design, the first switch may comprise a plurality of MOS transistors coupled in a stack, e.g., as shown in FIG. 8. A plurality of resistors may be coupled to the plurality of MOS transistors and may receive a control signal to open or close the switch.

In another exemplary design, an integrated circuit may comprise a power amplifier, a first switch, and an output circuit, e.g., as shown in FIG. 3. The power amplifier (e.g., power amplifier 340) may receive and amplify an input signal and provide an amplified signal in a first mode. The first switch (e.g., switch 350) may be coupled to the output of the power amplifier and may bypass the power amplifier and provide a bypass signal in a second mode. The output circuit (e.g., output circuit 360) may be coupled to the power amplifier and the first switch. The output circuit may perform output impedance matching for the power amplifier in the first mode. The output circuit may (i) receive the amplified signal and provide an output signal in the first mode and (ii) receive the bypass signal and provide the output signal in the second mode.

In an exemplary design, the integrated circuit may further comprise first and second matching circuits, e.g., as shown in FIG. 3. The first matching circuit (e.g., matching circuit 330) may be coupled to the input of the power amplifier and may perform input impedance matching for the power amplifier in the first mode. The second matching circuit may be coupled to the first switch and may perform impedance matching in the second mode. The integrated circuit may further comprise a driver amplifier and second and third switches. The driver amplifier (e.g., driver amplifier 320) may receive and amplify a second input signal and provide a second amplified signal. The second switch (e.g., switch 322) may be coupled between the driver amplifier and the first matching circuit and may route the second amplified signal to the first matching circuit in the first mode. The third switch (e.g., switch 324) may be coupled between the driver amplifier and the second matching circuit and may route the second amplified signal to the second matching circuit in the second mode.

In an exemplary design, the integrated circuit may further comprise a second power amplifier and a second switch, e.g., as shown in FIG. 4. The second power amplifier (e.g., power amplifier 342) may receive and amplify the input signal and provide a second amplified signal in the first mode. The second switch (e.g., switch 352) may be coupled to the output of the second power amplifier and may bypass the second power amplifier and provide the bypass signal in the second mode. The output circuit (e.g., output circuit 362) may be further coupled to the second power amplifier and the second switch. The output circuit may perform output impedance matching and signal combining for the two power amplifiers in the first mode. The output circuit may (i) receive the two amplified signals and provide the output signal in the first mode and (ii) receive the bypass signal and provide the output signal in the second mode.

In an exemplary design, the output circuit may comprise first and second input stages and an output stage, e.g., as shown in FIG. 9A. The first input stage (e.g., input stage 910a) may be coupled to the output of the power amplifier and may perform output impedance matching for the power amplifier. The second input stage (e.g., input stage 910n) may be coupled to the output of the second power amplifier and may perform output impedance matching for the second power amplifier. The output stage (e.g., output stage 920) may be coupled to the first and second input stages and may perform impedance matching from a target intermediate impedance (Zint) to a target output impedance (Zout).

Figure 10:
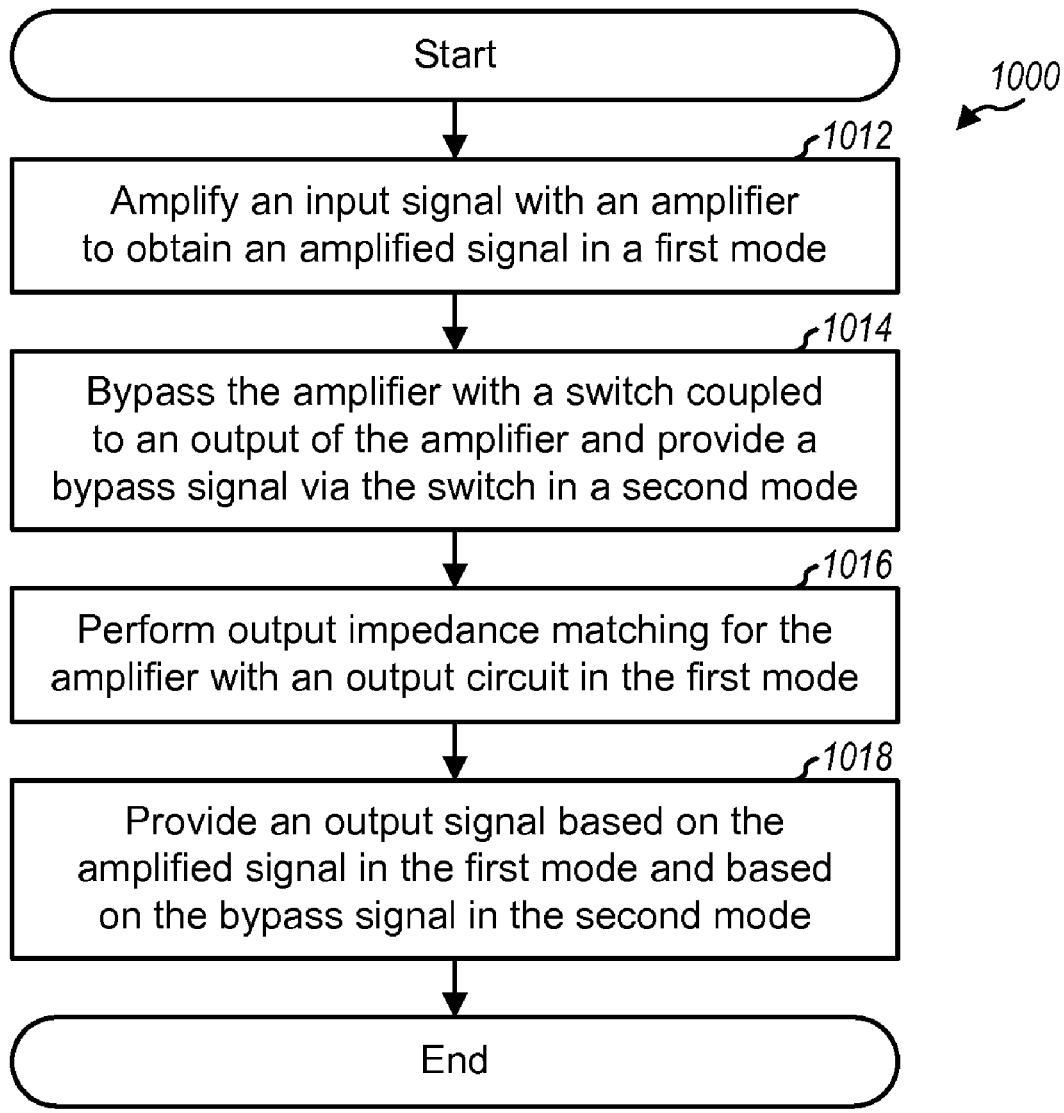
FIG. 10 shows a process for performing signal amplification.

FIG. 10 shows an exemplary design of a process 1000 for performing signal amplification. An input signal may be amplified with an amplifier (e.g., a power amplifier) to obtain an amplified signal in a first mode (block 1012). The amplifier may be bypassed with a switch coupled to the output of the amplifier, and a bypass signal may be provided via the switch in a second mode (block 1014). Output impedance matching may be performed for the amplifier with an output circuit in the first mode (block 1016). An output signal may be provided by the output circuit based on the amplified signal in the first mode and based on the bypass signal in the second mode (block 1018).

In an exemplary design, input impedance matching may be performed for the amplifier with a first matching circuit in the first mode. Impedance matching may also be performed with a second matching circuit coupled to the switch in the second mode. In an exemplary design, a second input signal may be amplified with a second amplifier (e.g., a driver amplifier) to obtain a second amplified signal. The second amplified signal may be routed to the first matching circuit in the first mode and to the second matching circuit in the second mode.

In an exemplary design, the input signal may be amplified with a second amplifier (e.g., another power amplifier) to obtain a second amplified signal in the first mode. The second amplifier may be bypassed with a second switch coupled to the output of the second amplifier, and the bypass signal may be provided via the second switch in the second mode. Output impedance matching may be performed for the second amplifier with the output circuit in the first mode. The output signal may be provided by the output circuit based on the two amplified signals in the first mode.

The amplifier module described herein may be implemented on an IC, an analog IC, an RFIC, a mixed-signal IC, an ASIC, a printed circuit board (PCB), an electronic device, etc. The amplifier module may also be fabricated with various IC process technologies such as complementary metal oxide semiconductor (CMOS), NMOS, P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifier module described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first amplifier to receive and amplify an input signal and provide an amplified input signal in each of a first mode and a second mode;
   a second amplifier to receive and further amplify the amplified input signal and provide an amplified signal in the first mode;
   a switch coupled to an output of the second amplifier and to bypass the second amplifier and provide a bypass signal in the second mode; and an output circuit coupled to the second amplifier and the switch, the output circuit performs output impedance matching for the second amplifier in the first mode, receives the amplified signal and provides an output signal in the first mode, and receives the bypass signal and provides the output signal in the second mode.

2. The apparatus of claim 1, the second amplifier comprises a power amplifier that is enabled in the first mode and disabled in the second mode.

3. The apparatus of claim 1, further comprising:
a first matching circuit coupled to an input of the second amplifier and to perform input impedance matching for the second amplifier in the first mode; and
a second matching circuit coupled to the switch and to perform impedance matching in the second mode.

4. The apparatus of claim 3, further comprising:
a third amplifier to receive and amplify the amplified input signal and provide a second amplified signal; and
a second switch coupled to an output of the third amplifier and to bypass the third amplifier and provide a second bypass signal in the second mode.

5. The apparatus of claim 4, the second amplifier and the third amplifier are enabled in the first mode, and the second amplifier and the third amplifier are disabled in the second mode.

6. The apparatus of claim 4, the third amplifier observes a target output impedance equivalent to the first matching circuit in the first mode and from the second matching circuit in the second mode.

7. The apparatus of claim 1, the amplifier comprises
a plurality of metal oxide semiconductor (MOS) transistors coupled in a stack, one of the plurality of MOS transistors receives the input signal and another one of the plurality of MOS transistors provides the amplified signal.

8. The apparatus of claim 1, the switch comprises
a plurality of metal oxide semiconductor (MOS) transistors coupled in a stack, and
a plurality of resistors coupled to the plurality of MOS transistors and to receive a control signal to open or close the switch.

9. An apparatus comprising:
an amplifier to receive and amplify an input signal and provide an amplified signal in a first mode;
a switch coupled to an output of the amplifier and to bypass the amplifier and provide a bypass signal in a second mode;
an output circuit coupled to the amplifier and the switch, the output circuit performs output impedance matching for the amplifier in the first mode, receives the amplified signal and provides an output signal in the first mode, and receives the bypass signal and provides the output signal in the second mode;
a second amplifier to receive and amplify the input signal and provide a second amplified signal in the first mode; and
a second switch coupled to an output of the second amplifier and to bypass the second amplifier and provide the bypass signal in the second mode, and
the output circuit is further coupled to the second amplifier and the second switch, the output circuit performs output impedance matching and signal combining for the amplifier and the second amplifier in the first mode, receives the amplified signal and the second amplified signal and provides the output signal in the first mode, and receives the bypass signal and provides the output signal in the second mode.

10. The apparatus of claim 9, the amplifier and the second amplifier are enabled in the first mode and are disabled in the second mode.

11. The apparatus of claim 9, the output circuit comprises
a first input stage coupled to the output of the amplifier,
a second input stage coupled to the output of the second amplifier, and
an output stage coupled to the first and second input stages.

12. The apparatus of claim 11, the first input stage performs output impedance matching for the amplifier, the second input stage performs output impedance matching for the second amplifier, and the output stage performs impedance matching from a target intermediate impedance to a target output impedance.

13. The apparatus of claim 12, the target intermediate impedance is equal to the target output impedance divided by N, where N is number of amplifiers coupled to the output circuit.

14. The apparatus of claim 9, further comprising:
a first matching circuit coupled to inputs of the amplifier and the second amplifier and to perform input impedance matching for the amplifier and the second amplifier in the first mode; and
a second matching circuit coupled to the switch and the second switch and to perform impedance matching in the second mode.

15. The apparatus of claim 14, further comprising:
a third amplifier to receive and amplify a second input signal and provide a third amplified signal;
a third switch coupled between the third amplifier and the first matching circuit, the third switch routes the third amplified signal to the first matching circuit in the first mode; and
a fourth switch coupled between the third amplifier and the second matching circuit, the fourth switch routes the third amplified signal to the second matching circuit in the second mode.

16. An integrated circuit comprising:
a driver amplifier to receive and amplify an input signal and provide an amplified input signal in each of a first mode and a second mode;
a power amplifier to receive and amplify the amplified input signal and provide an amplified signal in the first mode;
a switch coupled to an output of the power amplifier and to bypass the power amplifier and provide a bypass signal in the second mode; and
an output circuit coupled to the power amplifier and the switch, the output circuit performs output impedance matching for the power amplifier in the first mode, receives the amplified signal and provides an output signal in the first mode, and receives the bypass signal and provides the output signal in the second mode.

17. The integrated circuit of claim 16, further comprising:
a first matching circuit coupled to an input of the power amplifier and to perform input impedance matching for the power amplifier in the first mode; and
a second matching circuit coupled to the switch and to perform impedance matching in the second mode.

18. The integrated circuit of claim 17, further comprising:
a second power amplifier to receive and amplify the amplified input signal and provide a second amplified signal; and
a second switch coupled to an output of the second power amplifier and to bypass the second power amplifier and provide a second bypass signal in the second mode.

19. An integrated circuit comprising:
a power amplifier to receive and amplify an input signal and provide an amplified signal in a first mode;
a switch coupled to an output of the power amplifier and to bypass the power amplifier and provide a bypass signal in a second mode;
an output circuit coupled to the power amplifier and the switch, the output circuit performs output impedance matching for the power amplifier in the first mode, receives the amplified signal and provides an output signal in the first mode, and receives the bypass signal and provides the output signal in the second mode;
a second power amplifier to receive and amplify the input signal and provide a second amplified signal in the first mode; and
a second switch coupled to an output of the second power amplifier and to bypass the second power amplifier and provide the bypass signal in the second mode, and
the output circuit is further coupled to the second power amplifier and the second switch, the output circuit performs output impedance matching and signal combining for the power amplifier and the second power amplifier in the first mode, receives the amplified signal and the second amplified signal and provides the output signal in the first mode, and receives the bypass signal and provides the output signal in the second mode.

20. The integrated circuit of claim 19, the output circuit comprises
a first input stage coupled to the output of the power amplifier and to perform output impedance matching for the power amplifier,
a second input stage coupled to the output of the second power amplifier and to perform output impedance matching for the second power amplifier, and
an output stage coupled to the first and second input stages and to perform impedance matching from a target intermediate impedance to a target output impedance.

21. A method of performing signal amplification, comprising:
amplifying an input signal with a first amplifier to obtain an amplified input signal in each of a first mode and a second mode;
amplifying the amplified input signal with a second amplifier to obtain an amplified signal in the first mode;
bypassing the second amplifier with a switch coupled to an output of the second amplifier and providing a bypass signal via the switch in the second mode;
performing output impedance matching for the second amplifier with an output circuit in the first mode; and
providing an output signal based on the amplified signal in the first mode and based on the bypass signal in the second mode.

22. The method of claim 21, further comprising:
performing input impedance matching for the second amplifier with a first matching circuit in the first mode; and
performing impedance matching with a second matching circuit coupled to the switch in the second mode.

23. The method of claim 22, further comprising:
amplifying the amplified input signal with a third amplifier to obtain a second amplified signal; and
routing the second amplified signal to the first matching circuit in the first mode and to the second matching circuit in the second mode.

24. A method of performing signal amplification comprising:
amplifying an input signal with an amplifier to obtain an amplified signal in a first mode;
bypassing the amplifier with a switch coupled to an output of the amplifier and providing a bypass signal via the switch in a second mode;
performing output impedance matching for the amplifier with an output circuit in the first mode; and
providing an output signal based on the amplified signal in the first mode and based on the bypass signal in the second mode;
amplifying the input signal with a second amplifier to obtain a second amplified signal in the first mode;
bypassing the second amplifier with a second switch coupled to an output of the second amplifier and providing the bypass signal via the second switch in the second mode;
performing output impedance matching for the second amplifier with the output circuit in the first mode; and
providing the output signal based on the amplified signal and the second amplified signal in the first mode.

25. An apparatus comprising:
means for amplifying an input signal to obtain an amplified input signal in each of a first mode and a second mode;
means for further amplifying the amplified input signal to obtain an amplified signal in the first mode;
means for bypassing the means for amplifying and providing a bypass signal in the second mode;
means for performing output impedance matching for the means for amplifying in the first mode; and
means for providing an output signal based on the amplified signal in the first mode and based on the bypass signal in the second mode.

* * * * *